United States Patent [19]

Faris

[11] 4,198,577

[45] Apr. 15, 1980

[54] LOOP DECODER FOR JOSEPHSON MEMORY ARRAYS

[75] Inventor: Sadeg M. Faris, Yorktown Heights, N.Y.

[73] Assignee: International Business Machines Corporation, Armonk, N.Y.

[21] Appl. No.: 936,147

[22] Filed: Aug. 23, 1978

Related U.S. Application Data

[63] Continuation of Ser. No. 807,951, Jun. 20, 1977, abandoned.

[51] Int. Cl.² ................... H03K 19/195; H03K 3/38
[52] U.S. Cl. ................................ 307/212; 307/277; 307/306; 365/162
[58] Field of Search .............. 302/212, 245, 277, 306; 340/166 SC; 365/160, 162

[56] References Cited

U.S. PATENT DOCUMENTS

| | | | |
|---|---|---|---|
| 3,043,512 | 7/1962 | Buckingham et al. | 307/212 X |
| 3,626,391 | 12/1971 | Anacker | 340/173.1 |

OTHER PUBLICATIONS

W. Anacker et al., "Matrix Decoder", IBM Technical Disclosure Bulletin vol. 17, No. 1, June 1974 pp. 280-281.

Primary Examiner—John Zazworsky
Attorney, Agent, or Firm—Thomas J. Kilgannon, Jr.

[57] ABSTRACT

Decoder circuit arrangements for use with Josephson memory device arrays are disclosed. In one circuit of N stages, an input circuit consists of a Josephson junction and a shunting impedance connected across the junction by means of a matched transmission line. The transmission line has two output portions each of which controls the actuation or nonactuation of a pair of devices of circuits similar to the above-described circuit which are disposed in series in a pair of branches of a serially disposed superconducting loop of a first stage. Each branch has a serially disposed address gate to which true and complement address signals are applied. Each succeeding stage is similar to the first stage except that each branch of each succeeding stage contains twice as many circuits similar to the above-mentioned first stage circuit. In the last stage of the decoder, only one of a plurality of devices associated with the output of each of the circuits would be selected depending on which of the true or complement lines of each stage were actuated. These output devices could be array line drivers, for example.

In another embodiment, in which all the address devices are disposed in series with the actuable device of an input stage, each of the address devices is shunted by a superconducting loop which, depending on a number of factors may or may not contain a serially disposed actuable device for resetting the address devices. The input stage consists of an actuable device and a shunting impedance connected across it by means of a transmission line which contains two output portions. Each of the output portions controls an actuable device disposed in series in each of the superconducting loops associated with the address devices of the first stage. Each of these actuable devices is shunted by an impedance using a transmission line which itself contains two output portions each of which is intended to control actuable devices disposed in series in the superconducting loops of the next stage.

37 Claims, 7 Drawing Figures

LOOP DECODER FOR JOSEPHSON MEMORY ARRAYS

This is a continuation of application Ser. No. 807,951 filed June 20, 1977, now abandoned.

BACKGROUND OF THE INVENTION

1. Field of the Invention

This invention relates generally to decoder circuits for the selection of storage devices in memory arrays. More specifically, it relates to loop decoder circuits which utilize Josephson junctions and superconducting loops which can be utilized in conjunction with bit-oriented memory arrays which incorporate Josephson junction memory cells. Still more specifically, it relates to decoder circuits which utilize serially disposed address devices which, in turn, control current flow in a plurality of superconducting loops each of which contains current steering circuits, the outputs of which control the actuation of $2^N$ similar circuits associated with a pair of loops of a succeeding (N+1) stage. Still more specifically, it relates to a decoder circuit which utilizes a plurality of serially disposed loops each branch of which contains $2^N/2$ circuits similar to a serially disposed first stage circuit which includes an actuable device shunted by an impedance connected across the device by a transmission line. The transmission line contains a pair of output portions one of which controls an actuable device of a similar circuit in each branch of a succeeding serially disposed loop. Each branch of each loop contains a serially disposed address device. Thus, each loop provides $2^N$ outputs which actuate $2^{N+1}$ actuable devices in $2^{N+1}$ circuits of a succeeding stage. The resulting decoder circuits provide advantages which include improved decoding time, improved density and improved margins over known decoders.

2. Description of the Prior Art

Tree decoders are well-known in the prior art. One such decoder is shown in FIG. 6 of U.S. Pat. No. 3,626,391, filed July 15, 1968 in the name of W. Anacker and assigned to the same assignee as the assignee of the present invention. These arrangements incorporate current steering and serially disposed actuable devices controlled by address lines block various paths so that a path is established to only one of a plurality of outputs to which current is directed.

Another decoder arrangement is shown in IBM Technical Disclosure Bulletin, Vol. 17, No. 1, June 1974, p. 280 in an article entitled "Matrix Decoder" by W. Anacker et al. In this arrangement, one out of a plurality of array lines is selected by simultaneously providing gate current to one group out of a plurality of groups of devices simultaneously with control lines each of which connects to a different actuable device in each of the plurality of groups. The application of a gate current selects one of the plurality of groups while the simultaneous application of a control current selects one device out of the selected group. Current then flows in the array line associated with the device that was actuated by the simultaneous application of gate and control currents.

SUMMARY OF THE INVENTION

In accordance with the broadest aspect of the present invention, a multistage decoder circuit is disclosed comprising an input stage circuit which includes an actuable device and a shunting impedance. The impedance and the actuable device are connected by an interconnection line which has at least two output portions. Also included is address loop means associated with each decoder stage. The circuit has at least a pair of address devices connected with each loop means. The actuation of one or the other of the address devices accesses $2^N/2$ circuits like the input circuit. The output portions of the circuits like the input circuit of the first stage to the Nth-1 stage being arranged so that $2^N$ outputs are available per stage; each output portion controlling an actuable device of a circuit like said input circuit. The output portions of the Nth stage are each electrically connected to $2^N$ circuits different from said input circuit and N has a value equal to 1, 2, 3, 4 . . . .

In accordance with the broadest aspects of the present invention, a multistage decoder circuit is disclosed which further includes means connected to each of the pair of address devices for actuating one of said pair per stage to provide for the actuation of one of the circuits different from said input circuit at a time.

In accordance with the broader aspects of the present invention, a multistage decoder is provided wherein the actuable device and at least one of the pair of address devices per stage is subjected to the same current.

In accordance with the broader aspects of the present invention, a multistage decoder circuit is provided wherein said impedance is a resistor or an actuable device capable of carrying Josephson current.

In accordance with the broader aspects of the present invention, a multistage decoder circuit is provided wherein said actuable device and said address devices are devices capable of carrying Josephson current.

In accordance with the broader aspects of the present invention, a multistage decoder circuit is provided wherein said address means is a closed conductive loop having first and second branches each of which is connected to $2^N/2$ circuits.

In accordance with more particular aspects of the present invention, a multistage decoder circuit is provided wherein said address loop means is a pair of closed conductive loops each of which is connected to $2^N/2$ circuits.

In accordance with still more particular aspects of the present invention, a multistage decoder circuit is provided wherein the resistor has values of resistance sufficient to render the associated actuable device latching or self-resetting.

In accordance with still more particular aspects of the present invention, a multistage decoder circuit is provided further including resetting means connected to said address loop means for suppressing circulating currents in said loop means.

It is, therefore, an object of this invention to provide a multistage decoder circuit which has reduced address and resetting times which, in turn, provides reduced memory cycle times.

Another object is to provide a loop decoder wherein the address loops instead of being independent of the decoders are integral parts of the decoder.

Still another object is to provide a loop decoder wherein the address loops do not cross any actuable device such as an interferometer thereby providing reduced loop inductances.

Still another object is to provide a loop decoder whereby the providing of address loops eliminates memory address registers thereby enhancing both circuit density and speed.

Yet another object is to provide a loop decoder which has improved operating margins over known tree decoders.

Still another object is to provide a loop decoder which is less sensitive to disturb currents than known decoders.

The foregoing and other objects, features and advantages of the invention will become apparent from the following more particular description of the preferred embodiment of the invention as illustrated in the accompanying drawings.

BRIEF DESCRIPTION OF THE DRAWINGS

FIG. 2 shows address loops both with and without reset gates. The former are utilized where the decoder loop resistance is a value such that the actuable gates associated with each decoder circuit are nonlatching or self-resetting. Where the decoder circuit resistance is of such a value that the decoder circuit actuable devices are latching, address loop resetting gates are required.

DESCRIPTION OF PREFERRED EMBODIMENTS

Figure 1A:
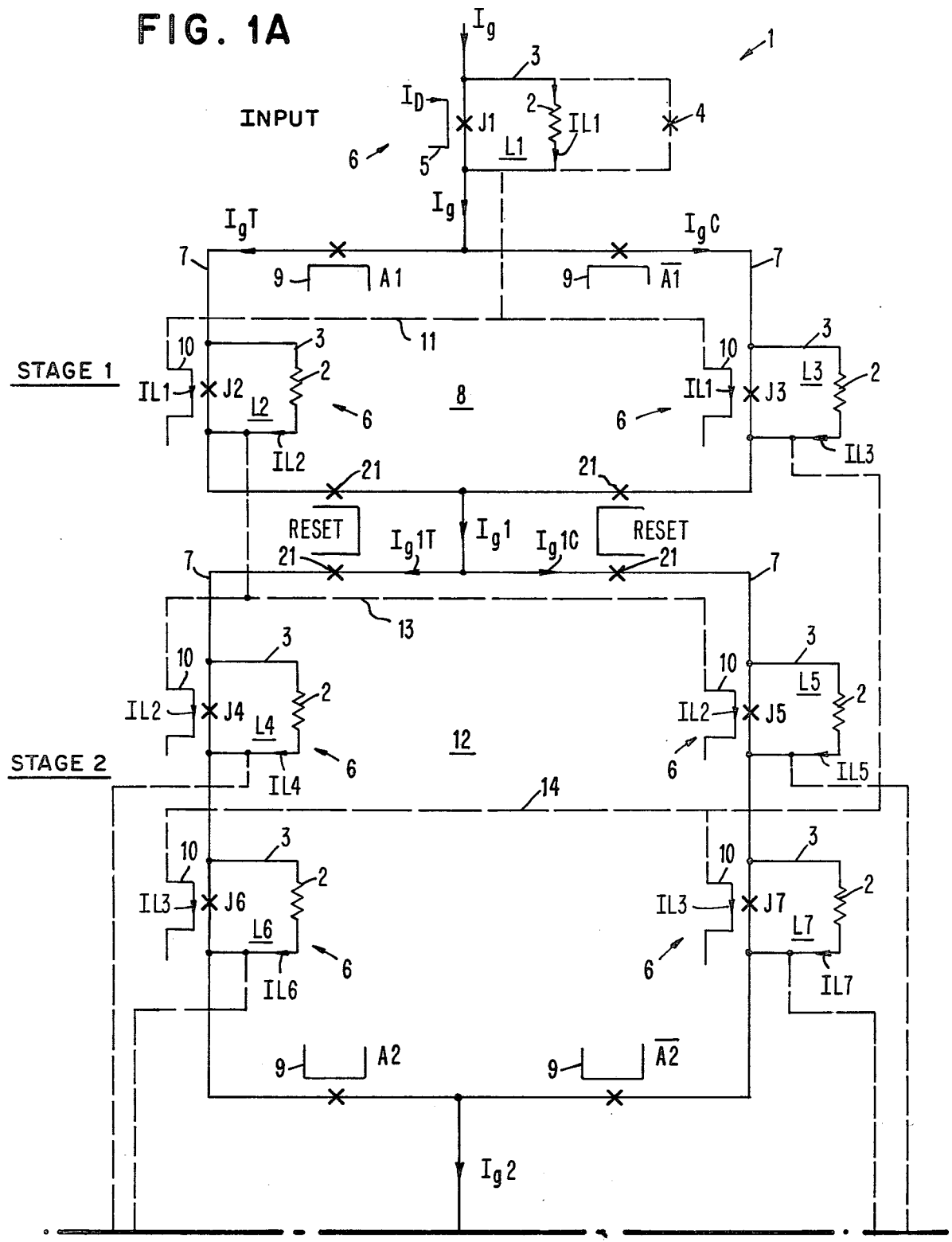
FIGS. 1A and 1B are schematic drawings of a loop decoder in accordance with the teaching of the present invention which utilizes a plurality of serially disposed address loops each branch of which contains at least one decoder circuit. Each stage after an input circuit stage includes an address loop each branch of which is controlled by an address device disposed in series with a decoder circuit. The first address loop contains two decoder circuits and each succeeding loop thereafter contains twice as many decoder circuits as a preceding loop. Since each decoder circuit has two outputs associated with it, these output portions control the actuable devices of the decoder circuits in a succeeding stage. The last stage of the decoder has $2^N$ circuits and outputs only one of which is selected to energize a driver which can be connected to an array line of a Josephson memory array.
Figure 1B:
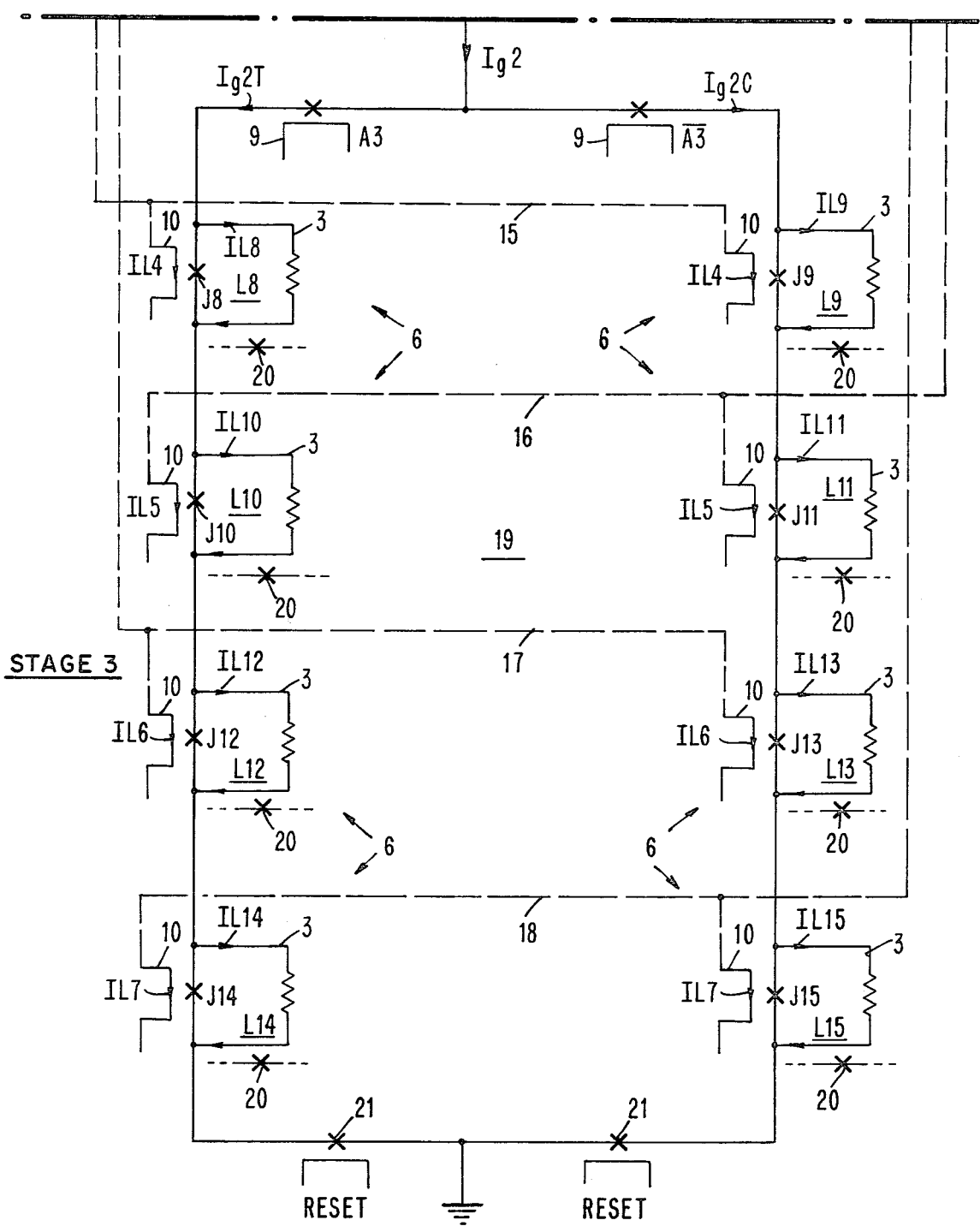

Referring now to FIGS. 1A and 1B, there is shown a schematic drawing of a loop decoder which utilizes a plurality of serially disposed address loops each branch of which contains at least one decoder circuit. Each stage after the input circuit includes an address loop each branch of which is controlled by an address device disposed in series with a decoder loop circuit which can be identified with the input circuit. The first address loop contains two decoder loop circuits and each succeeding address loop contains twice as many decoder loop circuits as the preceding loop. Since each decoder loop circuit has two outputs associated with it, these output portions control the actuable devices of the decoder loop circuits in a succeeding stage. The last stage of the decoder has $2^N$ circuits and outputs only one of which is selected to energize a driver which can be connected to an array line of a Josephson memory array.

Referring now to FIG. 1A in more detail, a three-stage decoder circuit 1 is shown the individual stages of which are identified as 1–3. The input consists of a Josephson device J1 shunted by an impedance 2 which may be a resistance or a Josephson device which is connected in parallel with device J1 by means of an interconnection line 3 which may be a transmission line of given characteristic impedance. Where interconnection line 3 is a transmission line, impedance 2 which is schematically shown as a resistor in Input of FIG. 1A would have a value equal to the characteristic impedance of interconnection line 3. As will be seen hereinafter, other criteria than the impedance of interconnection line 3 govern the value of resistance shunting device J1. For example, if it is desired that device J1 be latching, impedance 2 will have a relatively high value of resistance. If it is desired that device J1 be self-resetting or nonlatching, impedance 2 will have a relatively low value of resistance. As has already been suggested, impedance 2 need not be a resistance but may be a Josephson device which is fabricated to provide a desired value of resistance when its critical current is exceeded. A current source (not shown) feeds a gate current, $I_g$ to stage 1 while a control current source (not shown) feeds a control current $I_D$ to a control line 5. The latter is disposed in electromagnetically coupled relationship with device J1 and when currents $I_g$ and $I_D$ are both present, device J1 is switched from its zero voltage state to its voltage state in a manner well-known to those skilled in the Josephson art. The switching of device J1, as is also well-known, diverts current $I_g$ into interconnection line 3 and impedance 2. Then, depending on the value of resistance of impedance 2, device J1 either latches in the voltage state or resets to the zero voltage state when the control current $I_D$ is removed. In either instance, the diverted gate current otherwise designated in FIG. 1A as IL1 flows in a path designated L1 in FIG. 1A which is formed of impedance 2 and interconnection line 3. Where control current, $I_D$, does not flow in control line 5, device J1 does not switch and gate current, $I_g$, is not diverted into path L1. Current IL1 flowing in path L1, as is well-known, can be adapted to control the switching of a Josephson device disposed in an electromagnetically coupled relationship with it to sense the presence of current in path L1. In the present application, current IL1 flowing in path L1 is used to control two Josephson devices J2, J3 which are associated with circuits identical to that described in connection with the input stage, a pair of which make up stage 2 of decoder circuit 1. The circuit of the input consisting of device J1, impedance 2 and interconnection line 3 will hereinafter be designated as decoder loop circuit 6. Thus, stage 1 of decoder circuit 1 contains two decoder loop circuits 6 each of which is disposed in a branch 7 of an address loop 8. Each branch 7 of address loop 8 has disposed in series therein an address gate A1, $\overline{A1}$ to which true and complement address signals, respectively, are applied. Address gates A1, $\overline{A1}$ are Josephson devices similar to device J1 and in the regime of the present invention, when device $\overline{A1}$ is switched to the voltage state, device A1 is in the zero voltage state and vice versa. Address devices A1, $\overline{A1}$ are utilized to steer current, $I_g$, from input into one of the branches 7 of stage 1. At a time before address signals are applied to address gates A1, $\overline{A1}$ via address control lines 9, current $I_g$ splits proportional to the inductance of branches 7 of address loop 8. The application of an address pulse in control line 9 of device $\overline{A1}$ places that device in the voltage state causing gate current, $I_g$, to flow through address device A1 which is in its zero voltage state as a result of the absence of current in its associated control line 9. When all the gate current is diverted from address device $\overline{A1}$, it resets to the zero voltage state, in a well-known manner as a result of practically zero current flow through the device. From this, it should be clear that all the gate current, $I_g$, flows through device A1 and this current has been designated $I_gT$ in stage 1 to differentiate it from the current $I_gC$ which would flow in the right-most branch 7 of stages 1 if device A1 were switched to the voltage state and device $\overline{A1}$ were in the zero voltage state.

Recalling now that portions of interconnection line 3 are disposed in electromagnetically coupled relationship with devices J2, J3 to control the switching of these devices when current IL1 flows in path L1, control lines 10 adapted to carry current IL1 are shown disposed in electromagnetically coupled relationship with devices J2, J3 of stage 1 in FIG. 1A. To avoid an unduly complicated drawing, dashed line 11 is shown extending from the bottom of line 3 to control lines 10, to indicate that control lines 10 are serially disposed portions of line 3 all of which carry the same current, IL1. Current, IL1, of course, will flow in control lines 10 if device J1 of input is actuated by current, $I_D$ in control line 5. Where device J1 is unactuated, no current will flow in control lines 10 and devices J2, J3 remain unactuated. Under such circumstances, currents $I_gT$ or $I_gC$ flows through devices J2, J3 depending on which of the address gates A1, $\overline{A1}$ is actuated. When current IL1 flows in control lines 10, devices J2, J3 are actuated and the currents $I_gT$ or $I_gC$ flow in the impedances 2 associated with devices J2, J3 depending on which of the address gates A1, $\overline{A1}$ is actuated. In stage 1 the currents $I_gT$, $I_gC$ in paths L2, L3 are designated IL2, IL3, respectively. As with the current IL1 of Input, the currents IL2, IL3 are utilized to each control a pair of Josephson devices in decoder loop circuits 6 of the succeeding stage 2. Thus, IL2 flows in control lines 10 electromagnetically coupled to Josephson devices J4, J5 of a pair of decoder loop circuits 6; one of the circuits 6 being disposed in one branch 7 of address loop 12 while the other is disposed in the other branch 7 of address loop 12 of stage 2. Dashed line 13 indicates the control lines 10 of devices J4, J5 electromagnetically coupled thereto are serially disposed portions of transmission line 3 associated with J2 of stage 1 and carry the same current IL2. In a similar way, current IL3 is connected to control lines 10 of devices J6, J7 which form portions of another pair of decoder loop circuit 6 one of which is disposed in one branch 7 of address loop 12 and the other of which is disposed in the other branch 7 of address lopp 12. Decoder loop circuit 6 which contains device J6 is shown disposed in series with decoder loop circuit 6 which contains device J4. Similarly decoder loop circuit 6 which contains device J7 is shown disposed in series with decoder loop 6 which contains device J5. Dashed line 14 indicates that current IL3 flows in control lines 10 which are associated with devices J6, J7 and that these control lines 10 form a portion of interconnection line 3 which is associated with device J3 of stage 1.

Address devices A2, $\overline{A2}$ are each shown disposed in series in a different branch 7 of address loop 12 of stage 2. Address devices A2, $\overline{A2}$ which may be actuated from an address register in a well-known manner, are utilized to determine into which branch 7 of address loop 12 current $I_g1$ will flow. Current $I_g1$ is the output current from address loop 8 and is equal in magnitude to the gate current $I_g$ initially applied to the input of decoder loop circuit 6 of Input.

In a manner similar to that described in connection with stage 1, depending on which of the address gates A2, $\overline{A2}$ are actuated and which of the devices J4–J7 of stage 2 are simultaneously actuated, only one of the currents IL4–IL7 will be provided which will actuate a pair of actuable devices out of a plurality of pairs of actuable devices. Currents IL4, IL6 flow in paths L4, L6, respectively, when either J4 or J6 is switched and are equal to $I_g1T$ and $I_g1$. $I_g1T$ flows in left-most branch 7 when address device $\overline{A2}$ is actuated by means of current flow in its associated control line 9. Similarly, current IL5, IL7 flow in paths L5, L7, respectively, when J5 or J7 is switched and are equal to $I_81C$ and $I_g1$. $I_g1C$ flows in right-most branch 7 of address loop 12 when address gate A2 is actuated. The output current, $I_g2$ of stage 2 is the input current to stage 3 of FIG. 1B. Dashed lines 15–18 are shown extending from lines 3 of each of the decoder loop circuits 6 of stage 2 to pairs of control lines 10 which are disposed in electromagnetically coupled relationship with actuable devices of pairs of decoder loop circuits 6 in stage 3. Thus, current 1L4 controls the actuation of devices J8, J9 disposed in different branches 7 of address loop 19. Similarly, current IL5 controls devices J10, J11; current IL6 controls devices J12, J16 and current IL7 controls devices J14, J15. Address devices A3, $\overline{A3}$ are disposed in series in a different branch 7 of address loop 19. Then, in a manner similar to that discribed in connection with the previous stages, depending on which of the address gates A3, $\overline{A3}$ and which of the currents IL4-IL7 are provided, one of the currents IL8-IL15 is provided in path L8-L15 of decoder loop circuits 6 of stage 3. Thus, the actuation of address gate $\overline{A3}$ provides current $I_g2T$ in the left-most branch 7 of address loop 19 while the actuation of address gate A3 provides current $I_g2C$ in right-most branch 7 of address loop 19.

These currents are equal to $I_g2$ and currents IL8-IL15 are equal to $I_g2$ if they appear in an impedance 2 associated with the decoder loop circuits 6 of stage 3. Interconnection lines 3 of decoder loop circuit 6 of stage 3 are each shown disposed in electromagnetically coupled relationship with a Josephson device 20, which, for example, may be a portion of a driver circuit which provides current to a word or bit line of Josephson memory array.

Using the arrangement of FIG. 1B, current $I_g2$ which is equal to current $I_g$ initially applied to decoder circuit 1 is delivered to only one of the interconnection lines 3 of the decoder loop circuits 6 of stage 3. This current is then utilized to actuate a selected driver circuit or other device depending on which of the devices J1, A1 or $\overline{A1}$, A2 or $\overline{A2}$, or A3 or $\overline{A3}$ are actuated. For example, if devices J1, A1, $\overline{A2}$ and A3 are actuated, current $I_g$ will appear in impedance 2 of Input as current IL1 which, in turn, actuates devices J2, J3. Since address device A1 is actuated, current I appearing as $I_gC$ is diverted into right-most branch 7 of stage 1. Since device J3 of stage 1 is actuated, current $I_gC$ appearing as current IL3 in interconnection line 3 associated with device J3 flows in interconnection line 3 and actuates devices J6, J7 of the succeeding stage 2. Current IL3 appears at the output of stage 1 as current $I_g1$ where, because address device $\overline{A2}$ is actuated, it is diverted into left-most branch 7 of address loop 12 and appears in that branch as $I_g1T$. Since device J4 is unactuated, current flows through that device until it encounters actuated device J6 which causes it to be diverted into the interconnection line 3 associated with that device and current $I_g1T$ appears in line 3 as current IL6. This current in turn actuates devices J12, J13 of stage 3 via associated control windings 10 which carry that current. Current IL6 now appears at the output of address loop 12 as current $I_g2$ where, as the input to address loop 19, it is diverted into the right-most branch 7 of address loop 19 and appears therein as current $I_g2C$. The latter current flows through unactuated devices J9 and J11 until it encounters actuated device J13. Then current $I_g2C$ is diverted into interconnection line 3 associated with that device where it appears as current IL13. Current IL13 is used to actuate a device 20 disposed in electromagnetically coupled relationship with line 3 thereof which, in turn, is used to drive a word line of a memory array, for example. From thence current IL13 passes through unactuated device J15 to ground. From the foregoing example, it should be obvious that by actuating device J1 and various address gates, any one out of 8 possible outputs can be provided. It should also be obvious that the addition of other stages can provide for the selection of 1 out of 16 outputs and so on.

Earlier in this discussion, reference has been made to the fact that decoder loop circuit 6 associated with each of the address loops 8, 12, 19 can be latching or nonlatching by simply adjusting the value of the resistance to impedance 2 of each of decoder circuits 6. If the value of resistance of impedance 2 is relatively large, the Josephson devices shunted by such a value of resistance are latching in character and the circuit of FIGS. 1A, 1B would be unchanged from that just described. However, where the value of resistance of impedance 2 shunting each of the Josephson devices is relatively small, decoder circuits 6 are nonlatching or self-resetting in character. Because of the dynamics of the situation, and contrary to what might be expected, reset gates would be required in each of the branches 7 of address loops 8, 12, and 19 to eliminate circulating currents. Thus, separately actuated reset gates 21 would be disposed in each branch 7 of decoder loops 8, 12, and 19.

Referring now to decoder loop 8 of FIG. 1A and assuming that the resistance of impedance 2 of decoder loop 6 is sufficient to render such circuits latching in character and assuming address device A1 to be unactuated while address device $\overline{A1}$ is actuated, the dynamics of the situation are as follows:

Current $I_gC$ is diverted into the left-most branch 7 of address loop 8. With respect to address device $\overline{A1}$, that device encounters a current which is decaying while branch 7 encounters a current which is rising and reaches a steady state in a time which is a function of the inductance of address loop 8. When all the current has been removed from right-most branch 7, device $\overline{A1}$ resets immediately because the current has fallen below the $I_{min}$ of device $\overline{A1}$. At this point, assuming that devices J2, J3 are actuated by control current IL1, device J2 switches diverting current into path L2. Device $\overline{A1}$ which has already reset to the zero voltage state as a result of having no current in it, now presents a short circuit across left-most branch 7 of address loop 8. It should be noted that address device $\overline{A1}$ and device J3 are in the zero voltage state thereby presenting a short circuit path across left-most decoder circuit 6 of address loop 8. Current $I_gT$, upon switching of J2, now attempts to pass from left-most branch 7 into right-most branch 7 which is a short circuit. It cannot do so immediately because the branch current now sees the parallel combination of the resistance of impedance 2 of path L2 and the device resistance, $R_j$, of device J2 and decays with the time constant L/R where R is the parallel combination of the resistance of path L2 and the device resistance, $R_j$, of device J2.

The current in device J2 having been diverted to path L2 and having provided an output IL2 now decays in the same manner as the loop current and current builds up in device $\overline{A1}$ correspondingly. When the current in device J2 decays to a point where $I_{min}$ of device J2 is reached, that device resets to the zero voltage state. All the current is now in right-most branch 7 and device $\overline{A1}$ is ready for another cycle.

Where the resistance of path L2 is sufficiently small to render decoder loop circuit 6 of left-most branch 7 of address loop 8 nonlatching or self-resetting, a slightly different situation is encountered after device $\overline{A1}$ switches to the voltage state. While the build-up of current in left-most branch 7 of address loop 8 is exactly the same as that described in connection with operation in the latching mode described hereinabove, the dynamics of decoder circuit 6 are different once device J2 switches to the voltage state. At this point, the branch current $I_gT$ drops a small amount as a result of the current being diverted into impedance 2 of path L2. When device J2 switches, because of the high inductance of the address loop, the current in impedance 2 rises instantaneously to a peak value while current in the address loops drops only slightly as a function of the ratio of the inductances in the decoder loop to the inductance in the address loop. In the usual case, the ratio is 1:12. Further current drop in the address loop is precluded by device J2 resetting instantaneously to the zero voltage state because of the low resistance of impedance 2. The output pulse available in path L2 may be used to actuate a subsequent decoding loop. Now, however, because current remains in the address loop due to the zero voltage states in both devices J2 and $\overline{A1}$, the initial conditions must be brought about so a subsequent cycle can be carried out. This is accomplished by actuating reset gate 21 associated with right-most branch 7 of address loop 8. Typical values for the resistance of impedance 2 in loop decoder circuit 6 is 1 ohms for the latching situation and 0.2 ohms for the self-resetting situation at current levels of 2 ma.

Figure 2:
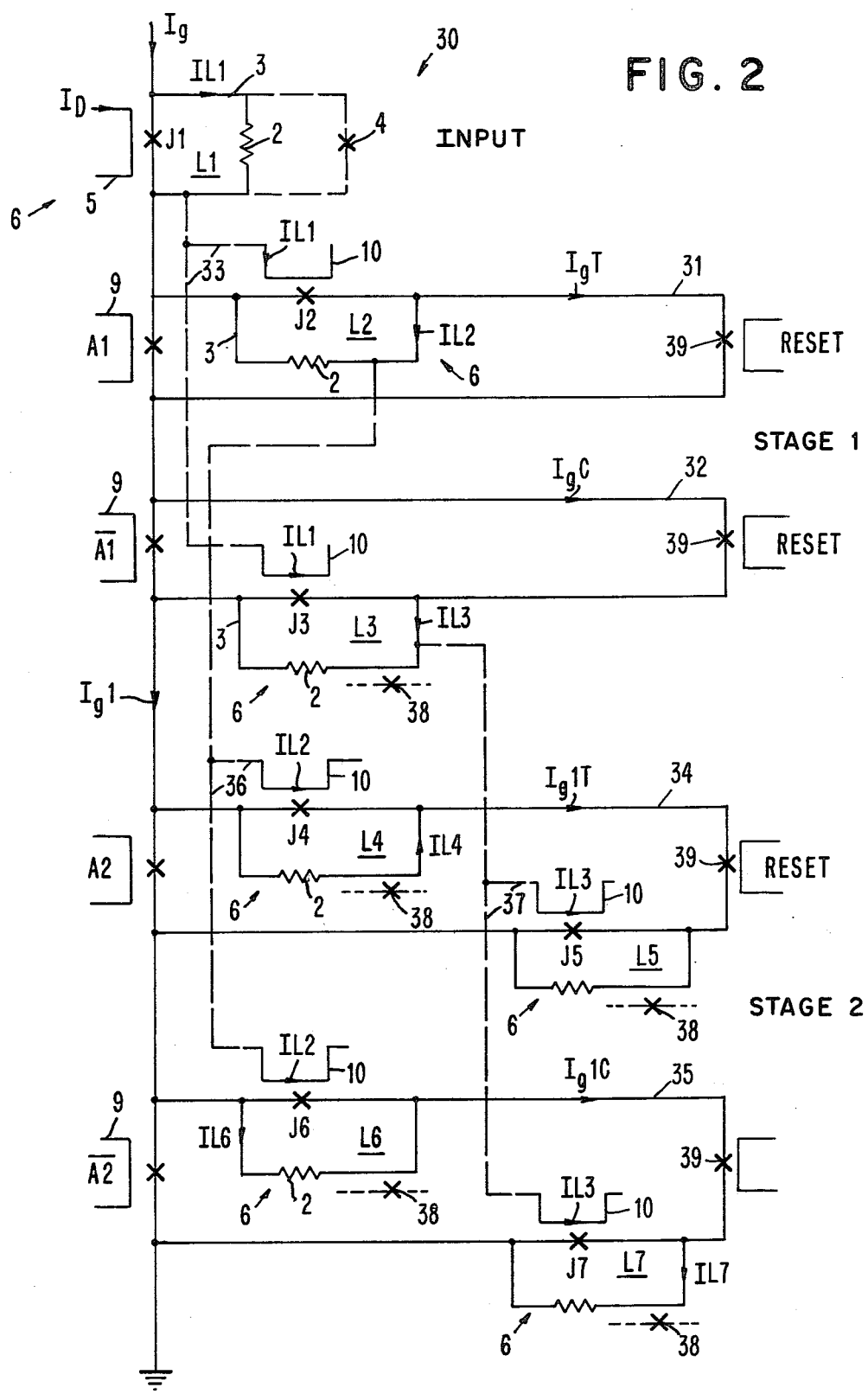
FIG. 2 is a schematic diagram of a loop decoder in which the address devices of the decoder are all connected in series. Each decoder stage after the input circuit is controlled by a pair of address devices and each of these is shunted by an associated loop. The input circuit of the decoder is an actuable device connected to a shunting impedance by a transmission line. The latter contains two output portions which are utilized to control the actuable devices of decoder circuits which are disposed in series in each of the address loops of succeeding decoder stages. Each stage contains $2^N$ decoder circuits and half of these are associated with each of the address loops of each stage. Thus, the second stage has four decoder circuits two of which are disposed in each address loop of that stage. Each of the actuable devices of the second stage is controlled by $2^N$ outputs available from the first stage. The last stage of the decoder of FIG. 2 provides one out of $2^2$ available outputs which may be utilized to energize a driver circuit which is associated with a Josephson memory array. Depending on the type of selection for such an array, at least two decoders, one for the horizontal selection and one for the vertical selection may be utilized.

Referring now to FIG. 2, there is shown therein a schematic diagram of a loop decoder in which the address devices of the decoder are all connected in series. Each decoder stage after the Input is controlled by a pair of address devices and each of these is shunted by an associated address loop. The Input of the decoder is an actuable device connected to a shunting impedance by a transmission line. The latter contains two output portions which are utilized to control the actuable devices of decoder loop circuits which are disposed in series in each of the address loops of succeeding decoder stages. Each stage contains $2^N$ decoder circuits and half of these are associated with each of the address loops of each stage. Thus, the second stage has four decoder circuits, 2 of which are disposed in each address loop of that stage. Each of the actuable devices of the second stage is controlled by $2^N$ outputs available from the first stage. The last stage of the decoder of FIG. 2 provides one out of $2^N$ available outputs which may be utilized to energize a driver circuit which is associated with a Josephson memory array line.

Referring now to FIG. 2 in more detail, Input of decoder circuit 30 is identical with decoder circuit 6 of FIG. 1 and the same elements in FIG. 2 are designated with the same reference characters as used in FIG. 1A and 1B. Impedance 2 may have a value of resistance equal to the characteristic impedance of transmission line 3 and, in addition, it may have values of resistance which render loop decoder circuit 6 of stage 1 either latching or self-resetting. As with Input of FIG. 1A, Josephson device J1 may be shunted by an actuable Josephson device instead of an impedance 2. If device J1 is actuated by a combination of the currents $I_g$ and ID, then, as described in connection with FIG. 1A, current $I_g$ is diverted into path L1 and appears therein as the current IL1. As will be seen in what follows, current IL1 will be utilized to actuate Josephson devices J2, J3 via control line portions 10 which are serially disposed portions of transmission line 3 of decoder loop circuit 6 of input.

Address devices A1, $\overline{A1}$ which are devices capable of carrying Josephson currents are shown in FIG. 2 disposed in series with device J1 and are shown shunted by address loops 31, 32, respectively. Address loops 31, 32 include serially disposed actuable devices J2, J3, respectively, which are capable of carrying Josephson current. Each of the devices J2, J3 is shunted by an impedance 2 and transmission line 3 forming paths L2, L3, respectively. Paths L2, L3 carry currents IL2, IL3, respectively, when devices J2, J3 are engaged depending on which of the address devices A1, $\overline{A1}$ is actuated. As indicated hereinabove, devices J2, J3 are actuated by an associated control line portion 10 which carries current IL1 through these serially disposed portions which form a portion of transmission line 3 of decoder loop 6 of Input. To avoid an unduly complicated drawing, dashed line 33 is shown extending from the bottom of transmission line 3 to control lines 10 indicating that control lines 10 are serially disposed portions of line 3, all of which carry the same current IL1. Address devices A1, $\overline{A1}$ are actuated by applying address current to associated control lines 9 and, when one of these devices is actuated, the other is unactuated. Thus, if device A1 is actuated, current $I_g$ appears in address loop 31 as current $I_g$T. Similarly when address device $\overline{A1}$ is actuated, current $I_g$ appears in loop 32 as current $I_g$C. These same currents appear in paths L2, L3 as currents IL2, IL3, respectively when J2, J3 are actuated.

Stage 2 of decoder circuit 30 is similar to stage 1 except that the address loops 34, 35 thereof each contain an additional decoder loop circuit 6 in the address loops. Thus, address devices A2, $\overline{A2}$ are shunted by address loops 34, 35 respectively, and the former contains a pair of serially disposed Josephson junctions J4, J5 while the latter similarly contains a pair of serially disposed Josephson junctions J6, J7. Each of these devices is shunted by an impedance 2 which is connected across each device by a transmission line 3. These elements make up paths L4-L7 which are adapted to carry currents IL4-IL7, respectively. Josephson devices J4, J5 are actuated by currents IL2, IL3 respectively. In a similar way, Josephson devices J6, J7 are actuated by currents IL2 and IL3, respectively. These currents appear in associated control lines 10 which for those that carry current IL2 are serial portions of transmission line 3 of path L2. For those that carry current IL3, control lines 10 are serial portions of transmission line 3 of path L3. Again, to avoid an unduly complicated drawing, dashed lines 36, 37 are shown extending from the bottom of paths L2, L3 respectively to control lines 10 and indicate that control lines 10 are serially disposed portions of line 3 of paths L2, L3, respectively.

As with the previously described address devices, devices A2, $\overline{A2}$, if actuated, divert current $I_g$ into loops 34 or 35 and that current appears therein as current $I_g$1T, $I_g$1C, respectively. Thus, depending on whether device J1 is actuated and which of the address devices is actuated, none or one of the outputs IL4-IL7 is provided as an output which may be utilized to actuate an associated Josephson device 38 disposed in electro-magnetically coupled relationship with paths L4-L7. Devices 38 may for example be utilized to energize a memory array line.

FIG. 2 shows reset gates 39 serially disposed in each of the address loops 31-35. Reset gates 39 are utilized in the same manner as reset gates 21 of FIG. 1. They are utilized in the mode wherein the value of resistance of impedance 2 associated with each of the devices J1-J7 has a value of resistance sufficiently small to make the devices self-resetting. Where this same impedance has a value of resistance which is much higher, devices J1-J7 operate in a latching mode and no reset gates 39 are required.

If device J1 is actuated and address devices $\overline{A1}$ and A2 are actuated, current IL5 is provided in the path L5 actuating its associated Josephson device 38. Thus, the actuation of J1 provides current IL1 in path L1. This current appears in stage 1 as $I_g$1 and passes through address device A1 which is unactuated. This same current, however, encounters actuated address $\overline{A1}$ and it is diverted into loop 32 where it appears as $I_g$C. Because device J3 is actuated as a result of current IL1 being present in its associated control line 10, current $I_gC$ is diverted into path L3 and appears therein as current IL3. Current IL3 leaves address loop 32 and appears as current $I_g1$ as an input to stage 2. Because address device A2 is actuated, current $I_g1$ is diverted into loop 34 and appears therein as current $I_g1T$. This current, because it encounters actuated Josephson device J5 as a result of current IL3 appearing in its associated control line 10, is diverted into path L5 where it appears as output current IL5.

It should be appreciated, at this point, that the arrangement of FIG. 2 can be extended to any number of stages to provide for the selection of 1 out of 8, 1 out of 16 or 1 out of 32 outputs, for example.

Figure 3A:
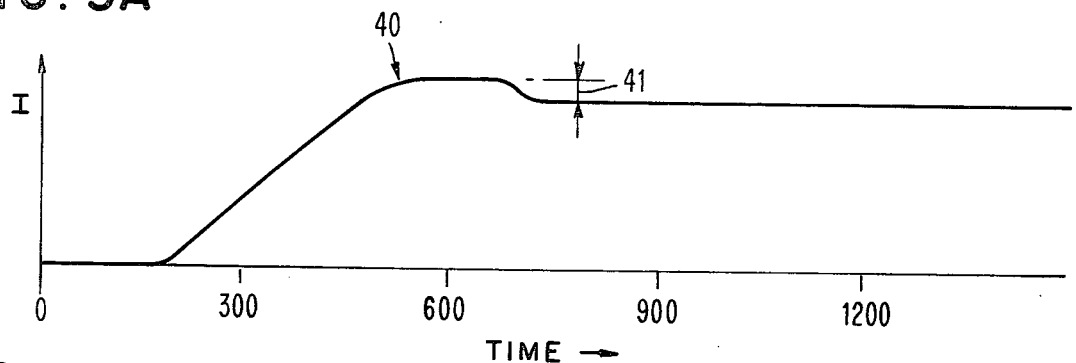
FIG. 3A is a graphical representation of the current waveform in an address loop of FIG. 2 when the resistance shunting a decoder circuit is of such a value that the actuable device of the decoder circuit is nonlatching or self-resetting.
Figure 3B:
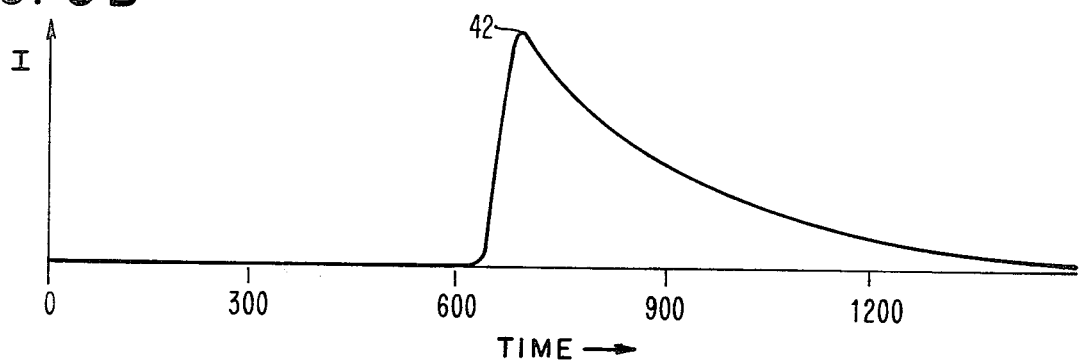
FIG. 3B is a graphical representation of a current waveform as it appears in the output transmission line circuit of a decoder circuit of FIG. 2 when the resistance in the output transmission line circuit is of such value as to make its associated actuable device nonlatching or self-resetting. Reset gates are required in this regime.

Referring now to FIGS. 3A–3B, FIG. 3A is a graphical representation of the current waveform in an address loop when the resistance shunting a decoder circuit 6 is of such a value that the actuable device thereof is nonlatching or self-resetting and FIG. 3B is a graphical representation of the resulting current waveform as it appears in the output transmission line of a decoder circuit 6.

Considering FIGS. 3A–3B, in conjunction with address device A1 and address loop 31 of FIG. 2, when device A1 switches, current is diverted into address loop 31. Address loop 31 encounters a rising current which is a function of the inductance of loop 31 and reaches a steady state condition as indicated at 40 in FIG. 3A. At this point, device J2 switches diverting current $I_gT$ momentarily into path L2 as current IL2. However, because the resistance of the impedance in path L2 is small, device J2 resets to the zero voltage state immediately, causing current $I_gT$ to drop only a small amount as shown at 41 in FIG. 3A. When device J2 switched, because of the high inductance of address loop 31, the current in impedance 2 of path L2 rises instantaneously to a peak value as shown at 42 in FIG. 3B while current in address loop 31 drops only slightly as a function of the ratio of the inductance in decoder loop circuit 6 to the inductance in address loop 31. In a usual case, the ratio may be 1:12. Further current drop in address loop 31 is precluded by device J2 resetting instantaneously to the zero voltage state because of the low resistance of impedance 2. The output pulse available in path L2 may be used to actuate a subsequent decoder loop circuit 6. Now, however, because current remains in address loop 31 due to the zero voltage states of both devices J2 and A1, the initial conditions must be brought about so a subsequent cycle can be carried out. This is accomplished by actuating reset gate 39 associated with address loop 31.

Where the resistance of impedance 2 of decoder loop circuit 6 associated with device J2 is sufficient to render such circuits latching in character, the situation is slightly different and reset gates 39 are not required. When address device A1 is actuated, the current $I_gT$ appears in address loop 31 and the current rises to a steady state value shown at 40 in FIG. 4A in the same manner as described in connection with FIG. 3A. When all the current has been diverted into address loop 31, address device A1 resets immediately because current has fallen below the $I_{min}$ of the device. At this point, device J2 is actuated by current IL1 and device J2 switches diverting current into path L2. Device A1 which has already reset to the zero voltage state as a result of having no current in it, now presents a short circuit across address loop 31. Current $I_gT$ now attempts to pass from address loop 31 into the now short-circuited branch which contains address device A1. It cannot do so instantaneously because the loop current now encounters the parallel combination of the resistance of impedance 2 of path L2 and the device resistance, $R_j$ of device J2 and decays with the time constant $L/R$ where R is the parallel combination of the resistance of impedance 2 and the device resistance, $R_j$, of device J2.

Figure 4A:
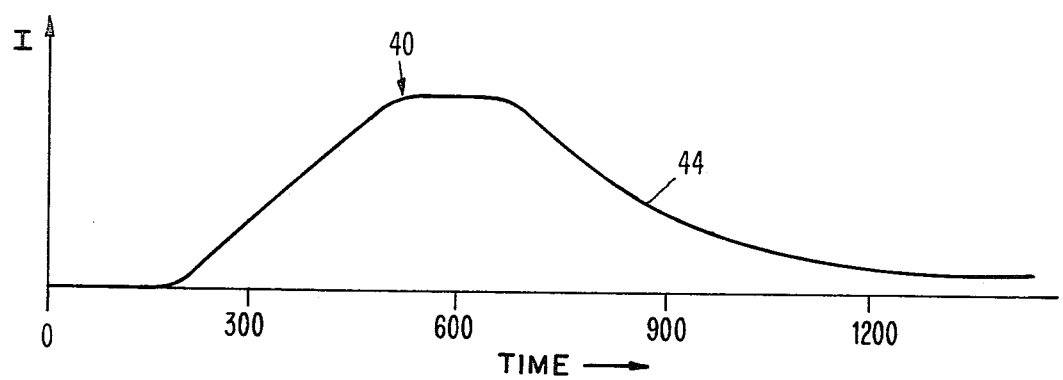
FIG. 4A is a graphical representation of a current waveform which appears in an address loop of FIG. 2 when its associated device is switched and where the value of resistance in the decoder circuits is sufficient to render the associated actuable devices latching in character. No reset gates are required in this regime.
Figure 4B:
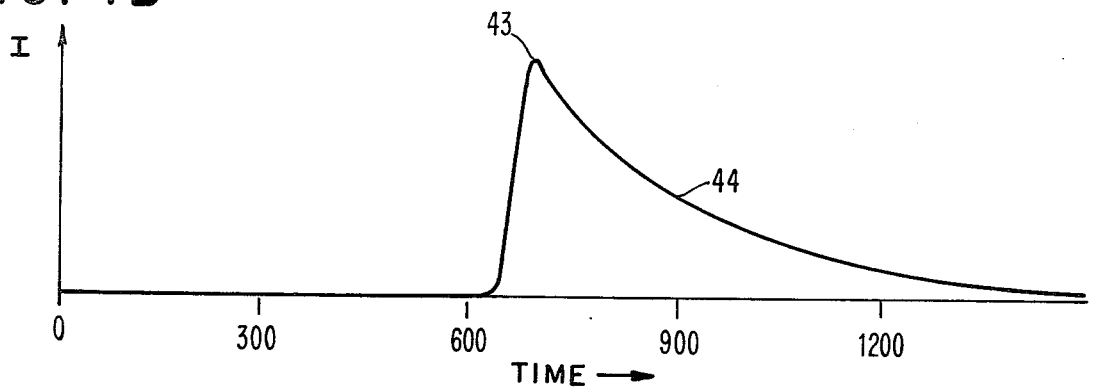
FIG. 4B is the waveform of the current which appears in the output transmission line circuit of the decoder circuit of FIG. 2 and is similar to that shown in FIG. 3B.

The current in device J2 having been diverted and having provided an output 43 as shown in FIG. 4B now decays in the same manner as the current in address loop 31 and shown in FIG. 4A and 4B at 44. When the current in device J2 decays to a point where $I_{min}$ of device J2 is reached, that device resets to the zero voltage state. All the current is now removed from address loop 31 and flows in device A1 which is in the zero voltage state. Address device is now ready for another cycle.

The address devices and the actuable Josephson devices mentioned hereinabove in connection with FIGS. 1A, 1B and 2 may be any well-known type of Josephson junction or may be a multiple junction device known as an interferometer. In addition, all the interconnection circuitry like transmission lines 3, control conductors 9, 10 and the conductors of the various address loops are made from materials which are superconductive at the temperature of liquid helium (approximately 4.2° K.). Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971. Resistive terminations 2 which must not be superconductive at the circuit operation temperature may be fabricated with compatible materials which display resistance at the desired operating temperature. U.S. Pat. No. 3,913,120, Ser. No. 429,461 filed Dec. 28, 1973 and assigned to the same assignee as the present invention shows a material and method of fabrication for circuitry and terminating resistor which may be utilized in the practice of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A multi-stage decoder circuit comprising:
    an input circuit which has at least two output portions,
    address loop means disposed in each stage of said multi-stage decoder circuit at least a portion of said loop means of the first stage of said multi-stage decoder being connected to said input circuit, at least a portion of each of said loop means of each succeeding stage after the first stage being connected to at least a portion of said loop means of the preceding stage,
    at least a pair of actuable address devices disposed in one of a series and parallel electrically connected relationship with each said loop means, the actuation of one or the other of which accesses $2^N/2$ circuits which are connected to said loop means each of said circuits including an actuable device and a pair of output portions, the output portions of said circuits of the first stage to the Nth−1 stage being arranged so that $2^{N+1}$ outputs are available per stage each said output portion controlling an actuable device like said actuable device of a circuit like said circuits, the output portions of said Nth stage being electrically connected to $2^N$ driver circuits, said at least two output portions controlling actuable devices of said circuits of said first stage and wherein N=1,2,3,4 . . . .

2. A multi-stage decoder circuit according to claim 1 further including means connected to each said at least a pair of address devices for actuating one of said pair per stage to provide for the actuation of one of said driver circuits at a time.

3. A multi-stage decoder circuit according to claim 1 wherein said actuable device is a device capable of carrying Josephson current.

4. A multi-stage decoder circuit according to claim 1 wherein said actuable address devices are devices capable of carrying Josephson current.

5. A multi-stage decoder circuit according to claim 1 wherein said impedance is a resistor.

6. A multi-stage decoder circuit according to claim 1 wherein said interconnection line is a superconducting transmission line.

7. A multi-stage decoder circuit according to claim 1 wherein said address loop means is a closed conductive loop having first and second branches each of which is connected to said $2^N/2$ circuits.

8. A multi-stage decoder circuit according to claim 1 wherein said address loop means is a pair of closed conductive loops each of which is connected to said $2^N/2$ circuits.

9. A multi-stage decoder circuit according to claim 1 wherein said an actuable device like said actuable device is a device capable of carrying Josephson current.

10. A multi-stage decoder circuit according to claim 1 wherein each of said actuable address devices is disposed in parallel with said loop means.

11. A multi-stage decoder circuit according to claim 1 wherein each of said actuable address devices is disposed in said loop means.

12. A multi-stage decoder circuit according to claim 2 wherein said means for actuating one of said pair of address devices per stage includes at least one control line coupled to each of said address devices.

13. A multi-stage decoder circuit according to claim 5 wherein said resistor has a value of resistance sufficient to make said actuable device latching.

14. A multi-stage decoder circuit according to claim 5 wherein said resistor has a value of resistance sufficient to make said actuable device self-resetting.

15. A multi-stage decoder circuit according to claim 7 wherein said closed conductive loop is a superconductor.

16. A multi-stage decoder circuit according to claim 10 wherein each of said actuable address devices is disposed in series with the others of said actuable address devices and with said actuable device and said loop means is a conductive loop in parallel with each of said actuable address devices.

17. A multi-stage decoder circuit according to claim 11 wherein said loop means is a conductive loop having first and second branches each of said branches having one of said actuable address devices disposed therein.

18. A multi-stage decoder circuit according to claim 14 further including resetting means connected to said address loop means for suppressing circulating currents in said loop means.

19. A multi-stage decoder circuit comprising:
an input circuit having a pair of outputs,
a plurality of loop circuits each containing first and second branches disposed in series with said input circuit each said branch having an actuable address device disposed therein, the actuation of one or the other of which accesses $2^N/2$ circuits which are electrically connected in each branch of each said plurality of loop circuits each of said circuits including an actuable device and two outputs, the outputs of said circuits of the first of said loop circuits to the Nth−1 of said loop circuits being arranged so that $2^{N+1}$ outputs are available per loop circuit, each of said $2^{N+1}$ outputs controlling an actuable device like said actuable device in a circuit like said circuits, the outputs of said Nth loop being electrically connected to $2^N$ driver circuits, each of said pair of outputs of said input circuit controlling an actuable device of a circuit of said circuits of said first stage and wherein N=1,2,3,4 . . . .

20. A multi-stage decoder circuit according to claim 19 wherein said input circuit further includes an input actuable device, and an impedance, said input actuable device and said impedance being connected in parallel by a transmission line portions of which form said pair of outputs.

21. A multi-stage decoder circuit according to claim 19 further including means connected to said actuable address devices for actuating one or the other thereof per loop circuit to provide for the actuation of one of said driver circuits.

22. A multi-stage decoder circuit according to claim 20 wherein said actuable address devices and said input actuable device are devices capable of carrying Josephson current.

23. A multi-stage decoder circuit according to claim 20 wherein said impedance is a resistor.

24. A multi-stage decoder loop according to claim 20 wherein said loop circuits and said transmission line portions are super-conductors.

25. A multi-stage decoder circuit according to claim 23 wherein said resistor has a value of resistance sufficient to make said input actuable device self-resetting.

26. A multi-stage decoder circuit according to claim 23 wherein said resistor has a value of resistance sufficient to make said input actuable device latching.

27. A multi-stage decoder circuit according to claim 25 further including resetting means connected to each of said plurality of loop circuits for suppressing circulating currents in said loop circuits.

28. A multi-stage decoder circuit comprising:
an input circuit having a pair of outputs,
a plurality of actuable address devices disposed in series with said input circuit, a pair of said actuable address devices being allotted per stage of said multi-stage circuit,
an address loop circuit disposed in parallel with each of said actuable address devices the actuation of one or the other of any of said pair of actuable devices accessing $2^N/2$ circuits which are electrically connected in each of said address loop circuits each of said circuits including an actuable device and two outputs, the outputs of said circuits of said first stage to the Nth−1 stage of said multi-stage decoder circuit being arranged so that $2^{N+1}$ outputs are available per stage, each of said $2^{N+1}$ outputs controlling an actuable device like said actuable device in a circuit like said circuits, the outputs of said Nth stage being electrically connected to $2^N$ driver circuits, each of said pair of outputs of said input circuit controlling an actuable device of a circuit of said circuits of said first stage and wherein N=1,2,3,4 . . . .

29. A multi-stage decoder circuit according to claim 28 wherein said input circuit further includes an input actuable device, an impedance, said input actuable device and said impedance being connected in parallel by a transmission line portions of which form said pair of outputs.

30. A multi-stage decoder circuit according to claim 28 further including means connected to said actuable address devices for actuating one or the other thereof per stage to provide for the actuation of one of said driver circuits.

31. A multi-stage decoder circuit according to claim 29 wherein said actuable address devices and said input actuable device are devices capable of carrying Josephson current.

32. A multi-stage decoder circuit according to claim 29 wherein said impedance is a resistor.

33. A multi-stage decoder loop according to claim 29 wherein each said address loop circuit and said transmission line portions are superconductors.

34. A multi-stage decoder circuit according to claim 32 wherein said resistor has a value of resistance sufficient to make said input actuable device self-resetting.

35. A multi-stage decoder circuit according to claim 32 wherein said resistor has a value of resistance sufficient to make said input actuable device latching.

36. A multi-stage decoder circuit according to claim 34 further including resetting means connected to each said address loop circuit for suppressing circulating currents in said loop circuit.

37. A circuit comprising:
at least one input circuit having an input actuable device and a pair of outputs,
a plurality of actuable signal responsive devices disposed in series, a pair of said actuable signal responsive devices being allotted for the true and complement of each signal applied to said circuit,
a loop circuit disposed in parallel with each of said actuable signal responsive devices, the actuation of one or the other of said pair of actuable signal responsive devices accessing at least $2^N/2$ circuits which are electrically connected in each of said loop circuits each of said circuits including an actuable device and two outputs, the outputs of said circuits of the first pair of said loop circuits to the Nth−1 pair of said loop circuits being arranged so that $2^{N+1}$ outputs are available per pair of loops, each of said $2^{N+1}$ outputs controlling an actuable device like said actuable device in a circuit like said circuits,
each output of said at least one input circuit controlling an actuable device of a circuit of said circuits of said first pair of said loop circuits,
the outputs of said Nth pair of loops being connected to a plurality of switchable devices and wherein N=1,2,3,4 . . . .

* * * * *